United States Patent
Stein et al.

(10) Patent No.: US 11,821,598 B2
(45) Date of Patent: *Nov. 21, 2023

(54) APPARATUS AND METHOD FOR MASKING RESIDUAL VISIBLE LIGHT FROM AN INFRARED EMISSION SOURCE

(71) Applicant: VALEO NORTH AMERICA, INC., Troy, MI (US)

(72) Inventors: Gregory Stein, Seymour, IN (US); Jonathan Beauchamp, Seymour, IN (US); Brant Potter, Seymour, IN (US); Nathan Montgomery, Seymour, IN (US); John Orisich, Seymour, IN (US)

(73) Assignee: Valeo North America, Inc., Troy, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/847,465

(22) Filed: Jun. 23, 2022

(65) Prior Publication Data

US 2022/0316673 A1   Oct. 6, 2022

Related U.S. Application Data

(63) Continuation of application No. 16/670,945, filed on Oct. 31, 2019, now Pat. No. 11,396,986.

(Continued)

(51) Int. Cl.
*F21S 41/13* (2018.01)
*F21V 9/08* (2018.01)
(Continued)

(52) U.S. Cl.
CPC ............ *F21S 41/13* (2018.01); *B60Q 1/0094* (2013.01); *B60Q 1/1407* (2013.01); *F21S 41/141* (2018.01); *F21V 9/08* (2013.01)

(58) Field of Classification Search
CPC ......... F21S 41/13; B60Q 1/14; B60Q 1/1407; B60Q 1/1415; B60Q 1/1423; B60Q 1/143;
(Continued)

(56) References Cited

U.S. PATENT DOCUMENTS 5,233,465 A   8/1993   Wheatley et al.
6,459,083 B1  10/2002  Finkele et al.
(Continued)

FOREIGN PATENT DOCUMENTS

CN   207729485 U   8/2018
DE   202006003508 U1   6/2006
(Continued)

OTHER PUBLICATIONS

The International Bureau of WIPO, International Preliminary Report on Patentability and Written Opinion for International Application No. PCT/US2020/026194, dated Nov. 16, 2021.

*Primary Examiner* — Robert J May
(74) *Attorney, Agent, or Firm* — Valeo North America, Inc.

(57) ABSTRACT

A light masking system for a vehicle includes: a printed circuit board (PCB); at least one infrared (IR) light source disposed on a first surface of the PCB and configured to emit a first predetermined wavelength range of light; at least one masking light source disposed on the first surface of the PCB proximal to the IR light source and configured to emit a second predetermined wavelength range of light, wherein a portion of the emitted first predetermined wavelength range of light of the IR light source includes visible light; and the emitted second predetermined wavelength range of light of the at least one masking light source masks the emitted visible light from the first predetermined wavelength range of the at least one IR light source.

20 Claims, 12 Drawing Sheets

Related U.S. Application Data

(60) Provisional application No. 62/920,920, filed on May 23, 2019.

(51) Int. Cl.
  *B60Q 1/14* (2006.01)
  *B60Q 1/00* (2006.01)
  *F21S 41/141* (2018.01)

(58) Field of Classification Search
  CPC .. B60Q 1/1438; B60Q 1/1446; B60Q 1/1453; B60Q 1/1461; B60Q 1/1469; B60Q 1/1476; B60Q 1/1484; B60Q 1/1492
  See application file for complete search history.

(56) References Cited

U.S. PATENT DOCUMENTS

| | | | |
|---|---|---|---|
| 6,552,342 B2 | 4/2003 | Holz et al. |
| 6,601,980 B2 | 8/2003 | Kobayashi et al. |
| 6,609,812 B2 | 8/2003 | Machi et al. |
| 6,803,574 B2 | 10/2004 | Abel et al. |
| 6,896,396 B2 | 5/2005 | Yagi |
| 6,897,459 B2 | 5/2005 | Albou |
| 7,030,907 B2 | 4/2006 | Nagao et al. |
| 7,049,945 B2 | 5/2006 | Breed et al. |
| 7,059,752 B2 | 6/2006 | Yagi et al. |
| 7,114,828 B2 | 10/2006 | Yagi |
| 7,132,654 B2 | 11/2006 | Moisel |
| 7,295,104 B2 | 11/2007 | Irmscher et al. |
| 7,331,690 B2 | 2/2008 | Schmidt |
| 7,350,945 B2 | 4/2008 | Albou et al. |
| 7,372,055 B2 | 5/2008 | Harter, Jr. et al. |
| 7,527,405 B2 | 5/2009 | Tatsukawa |
| 7,838,836 B2 | 11/2010 | Robert et al. |
| 7,862,216 B2 | 1/2011 | Friedrichs et al. |
| 7,946,744 B2 | 5/2011 | Omi |
| 7,982,403 B2 | 7/2011 | Hohl-AbiChedid et al. |
| 7,988,346 B2 | 8/2011 | Helms et al. |
| 8,292,479 B2 | 10/2012 | Sazuka et al. |
| 8,465,171 B2 | 6/2013 | Kishimoto et al. |
| 8,477,044 B2 | 7/2013 | Wagner et al. |
| 8,482,204 B2 | 7/2013 | Noyori et al. |
| 8,816,306 B2 | 8/2014 | Yano, Jr. et al. |
| 9,045,080 B2 | 7/2015 | Yamamura |
| 9,080,742 B2 | 7/2015 | Otsuka |
| 10,908,334 B2 | 2/2021 | Schrama |
| 2004/0174712 A1 | 9/2004 | Yagi |
| 2005/0128727 A1 | 6/2005 | Remillard et al. |
| 2009/0052200 A1 | 2/2009 | Tessnow et al. |
| 2015/0092059 A1 | 4/2015 | Lu et al. |
| 2018/0335190 A1 | 11/2018 | Kresge |
| 2019/0063704 A1 | 2/2019 | Diederich |
| 2019/0252582 A1 | 8/2019 | Urasaki et al. |
| 2022/0074571 A1* | 3/2022 | Aas .................. F21S 41/18 |

FOREIGN PATENT DOCUMENTS

| | | |
|---|---|---|
| DE | 102008043880 A1 | 5/2010 |
| DE | 102007026780 A1 | 7/2011 |
| DE | 102011004293 A1 | 3/2012 |
| DE | 102011117246 A1 | 4/2012 |
| DE | 102008043880 A1 | 6/2012 |
| DE | 102013001275 A1 | 7/2014 |
| DE | 102016204370 B4 | 10/2017 |
| DE | 202017105794 U1 | 2/2019 |
| FR | 3008475 | 11/2018 |
| JP | 2004146162 A | 5/2004 |
| JP | 2005178576 A | 7/2005 |
| JP | 2005251477 A | 9/2005 |
| JP | 200618950 A | 1/2006 |
| JP | 2006347381 A | 12/2006 |
| JP | 200990844 A | 4/2009 |
| JP | 2009154615 A | 7/2009 |
| JP | 201067372 A | 3/2010 |
| JP | 2011198702 A | 10/2011 |
| JP | 5349940 B2 | 11/2013 |
| JP | 201449369 A | 7/2014 |
| JP | 201618668 A | 2/2016 |
| JP | 6526350 B1 | 6/2019 |
| KR | 100489672 B1 | 5/2005 |
| KR | 101428097 B1 | 8/2014 |
| WO | 2006086953 A1 | 8/2006 |
| WO | 2007042552 A1 | 4/2007 |
| WO | 2013048234 A1 | 4/2013 |
| WO | 2015033764 A1 | 3/2015 |

\* cited by examiner

APPARATUS AND METHOD FOR MASKING RESIDUAL VISIBLE LIGHT FROM AN INFRARED EMISSION SOURCE

INCORPORATION BY REFERENCE

This application is a continuation of U.S. application Ser. No. 16/670,945 filed Oct. 31, 2019 (US202000370723), which claims the benefit of U.S. Provisional Application No. 62/920,920 filed on May 23, 2019, the entire contents of which are incorporated herein by reference.

BACKGROUND

The "background" description provided herein is for the purpose of generally presenting the context of the disclosure. Work of the presently named inventors, to the extent it is described in this background section, as well as embodiments of the description which may not otherwise qualify as prior art at the time of filing, are neither expressly or impliedly admitted as prior art against the present invention.

An imaging system for a vehicle including an image sensor having a two-dimensional array of photosensitive pixels that includes at least one sub-array having first, second, third, and fourth photosensing pixels is described in US patent 20150092059A1 entitled "Imaging System for Vehicle", the entire disclosure of which is incorporated herein by reference. A polymeric multilayered film which reflects wavelengths of light in the infrared region of the spectrum while being substantially transparent to wavelengths of light in the visible spectrum without the effects of visibly perceived iridescent color is provided is described in U.S. Pat. No. 5,233,465 entitled "Visibly Transparent Infrared Reflecting Film with Color Masking", the entire disclosure of which is incorporated herein by reference. A vehicle light that can be used, for example, in a headlamp assembly for a headlight projection system for use with forward illumination, comprising a reflector and a light source operatively mounted with the reflector is described in US patent 20090052200A1 entitled "Single Source Visible and IR Vehicle Headlamp", the entire disclosure of which is incorporated herein by reference.

Near Infra-Red (NIR) light is important to use with autonomous vehicles for use in low light level areas for image/obstacle detection. Location of these illumination systems on the vehicle is important as regulations exist for nearly the entire vehicle when dealing with visible light emission. FIG. 1A shows an example spectrum of an NIR light emitting diode (LED) with a centroid peak of 850 nm. It may be appreciated that while LEDs are described throughout, other light sources and illuminators may be used. Emission from NIR LEDs may have a portion of the emission wavelength range located within the visible portion of the electromagnetic spectrum, making the NIR LEDs at least partially visible to a human eye, for example emitting a red glow. As shown in FIG. 1A, this may include, for example, emission below 780 nm. This partial visibility of the NIR LED may conflict with light regulations, for example Federal Motor Vehicle Safety Standard 108.

Attempts to block the NIR LED emission using filtering films may block only a portion of the residual visible light emitted by the NIR LED. Furthermore, filtering films may impact sensitivity of sensors in detecting NIR signals reflected off of obstacles. In another attempt to reduce emission in the visible range, 940 nm NIR LEDs may be used that have lower emission below 780 nm. However, performance of said 940 nm NIR LEDs may not be sufficient given hardware sensitivities. That is, sensitivity of sensors to 940 nm NIR LEDs may be approximately half as sensitive compared to detecting 850 nm NIR LEDs. In such a situation, the sensitivity of 940 nm NIR LEDs may be difficult to distinguish from noise levels and 850 nm NIR LEDs may be used to overcome said performance issues.

Thus, a system and method of masking the visible light emission of NIR LEDs is desired. A solution described herein to comply with regulations includes masking the NIR LED emission by employing other light emitting sources on the vehicle that emit at a predetermined intensity.

SUMMARY

The present disclosure relates to a light masking system for a vehicle, including: a printed circuit board (PCB); at least one infrared (IR) light source disposed on a first surface of the PCB and configured to emit a first predetermined wavelength range of light; at least one masking light source disposed on the first surface of the PCB proximal to the IR light source and configured to emit a second predetermined wavelength range of light, wherein a portion of the emitted first predetermined wavelength range of light of the IR light source includes visible light; and the emitted second predetermined wavelength range of light of the at least one masking light source masks the emitted visible light from the first predetermined wavelength range of the at least one IR light source.

The present disclosure additionally relates to a method of masking IR light in a light masking system for a vehicle, including setting, via processing circuitry, a predetermined emission luminous intensity of at least one IR light source disposed on a first surface of a printed circuit board (PCB), the IR light source configured to emit a predetermined wavelength range of light; setting, via processing circuitry, a predetermined emission luminous intensity of at least one masking light source disposed on the first surface of the printed circuit board (PCB) and proximal to the at least one IR light source, wherein the predetermined emission luminous intensity of the at least one masking light source is greater than the predetermined emission luminous intensity of the at least one IR light source; determining, via processing circuitry, when the vehicle is within a predetermined range of other vehicles; and adjusting, via processing circuitry, the predetermined emission luminous intensity of the at least one IR light source in response to being within a predetermined range of the other vehicles, wherein a portion of the emitted predetermined wavelength range of light of the IR light source includes visible light.

The present disclosure additionally relates to a method of masking IR light for a vehicle, including: locating at least one IR light source proximal to a visible light source on the vehicle, wherein the at least one IR light source is configured to emit a predetermined wavelength range of light with a predetermined luminous intensity; the visible light source is configured to emit a predetermined wavelength range of light in the visible spectrum with a predetermined luminous intensity; a portion of the emitted predetermined wavelength range of light of the IR light source includes visible light; the emitted predetermined wavelength range of light of the visible light source masks the emitted visible light from the predetermined wavelength range of the at least one IR light source.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "top," "bottom," "front," "rear," "side," "interior," "exterior," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Due to the visible light emission of NIR LEDs, said LEDs installed on vehicles may not comply with regulations for visible light emission as it relates to the emission location on the vehicle. For example, a red glow from an NIR LED along the front of the vehicle may not be within regulation since this may impact other drivers. Thus, a system and method to mask the emission of NIR LEDs utilizing other LEDs with predetermined emission spectra and intensities is described herein.

Figure 1A:
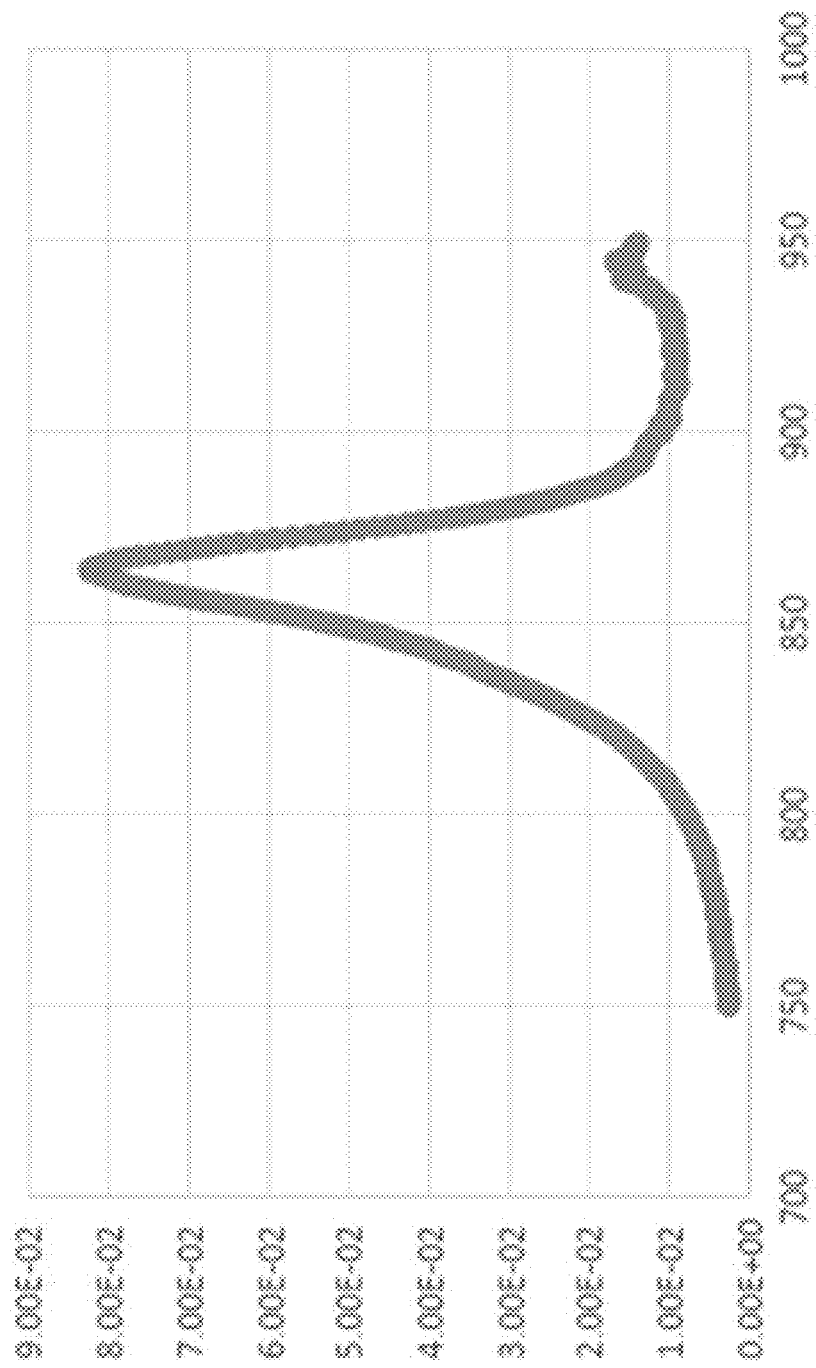
FIG. 1A is an example spectrum of an NIR light emitting diode (LED) with a centroid peak of 850 nm, according to an exemplary embodiment of the present disclosure.
Figure 1B:
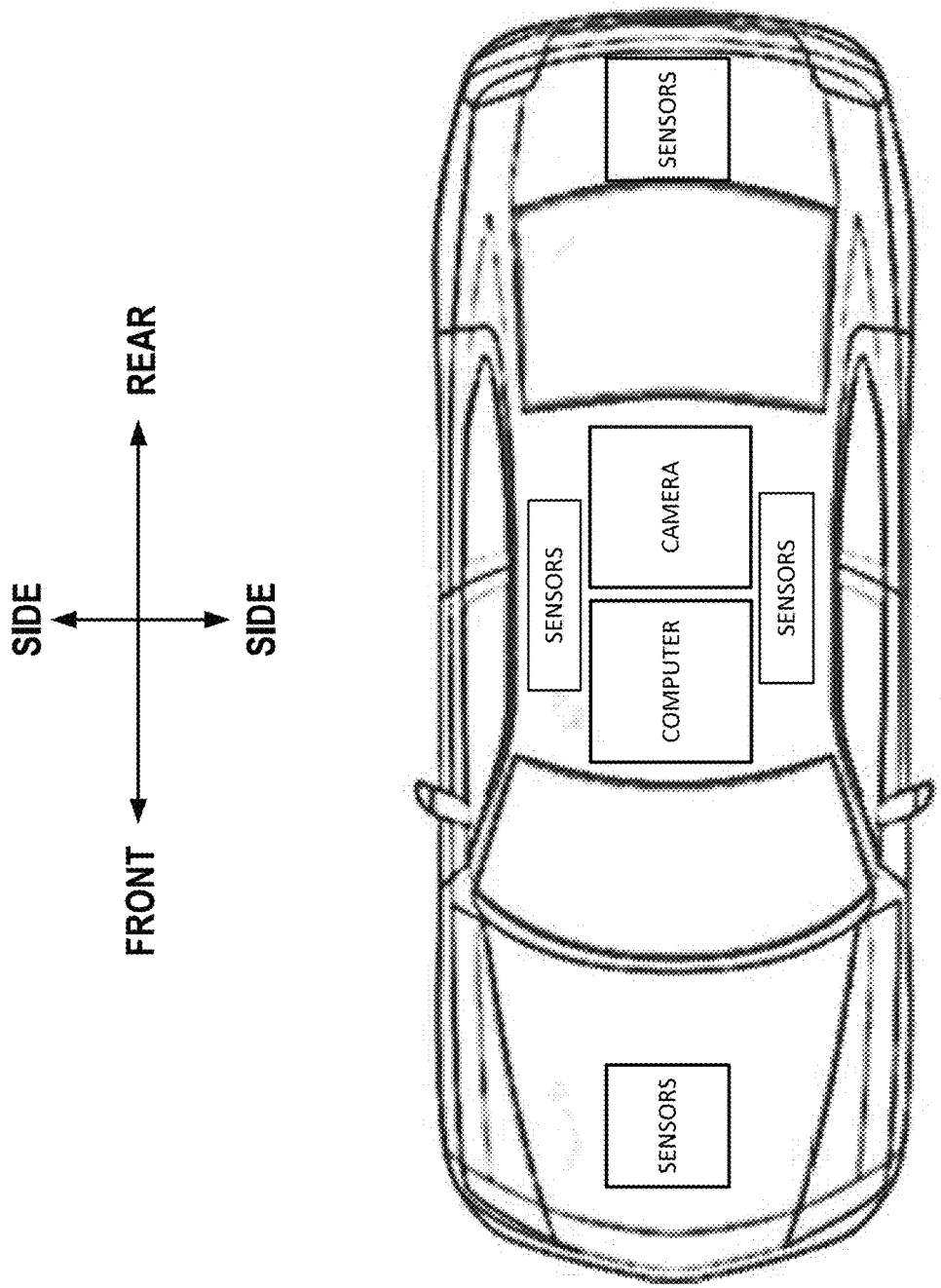
FIG. 1B shows a vehicle including a computer with processing circuitry, sensors, and cameras, according to an embodiment of the present disclosure.

FIG. 1B shows a vehicle that may include a computer with processing circuitry, sensors for detecting visible and IR light, and cameras for image capture, according to an embodiment of the present disclosure. According to regulations, for example SAE J578, a color of tail lights on a rear of the vehicle may be red with a luminous intensity of no less than 2 candela (cd), a color of rear side markers on a side and towards the rear of the vehicle may be red with a luminous intensity of no less than 0.25 cd, a color of front side markers on the side and towards the front of the vehicle may be amber with a luminous intensity of no less than 0.62 cd, and a color of headlights at a front of the vehicle may be white.

Figure 2A:
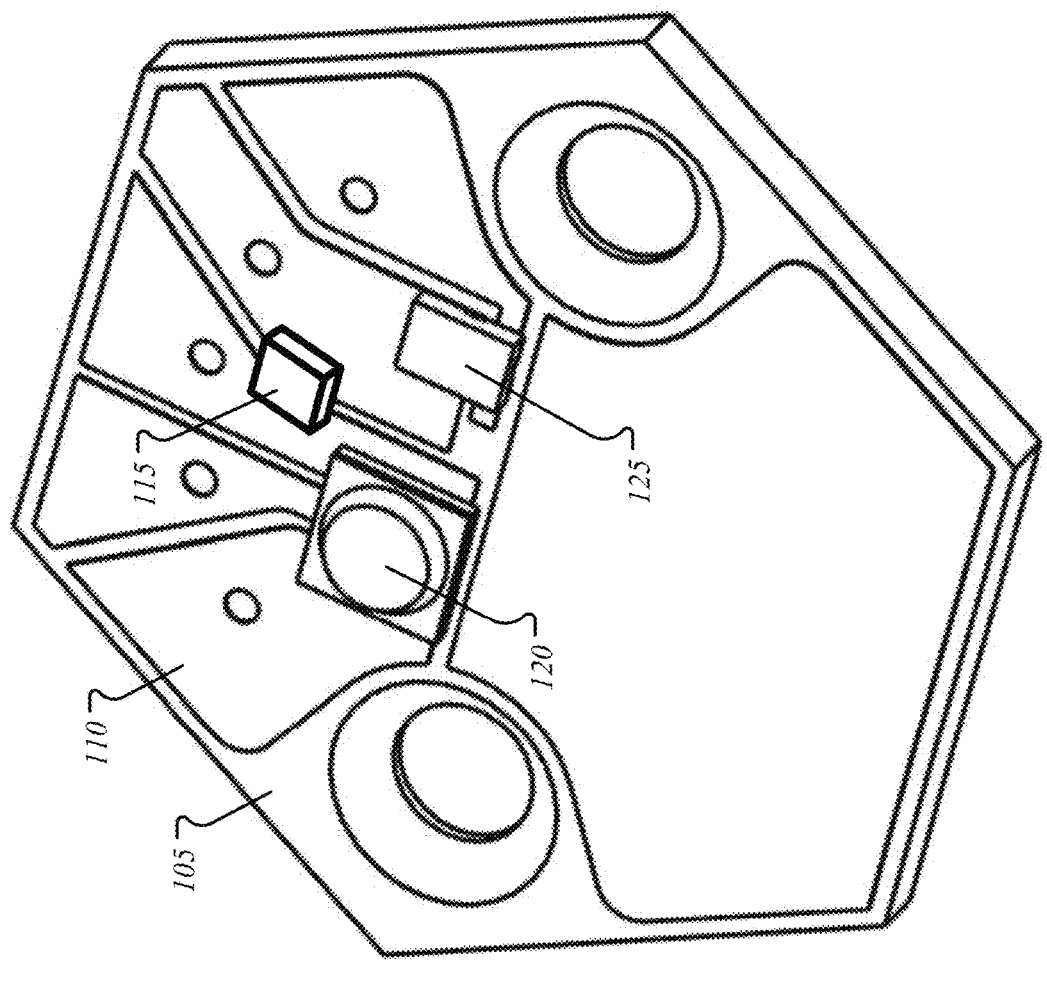
FIG. 2A is a perspective view of a light masking system, according to an exemplary embodiment of the present disclosure.
Figure 2B:
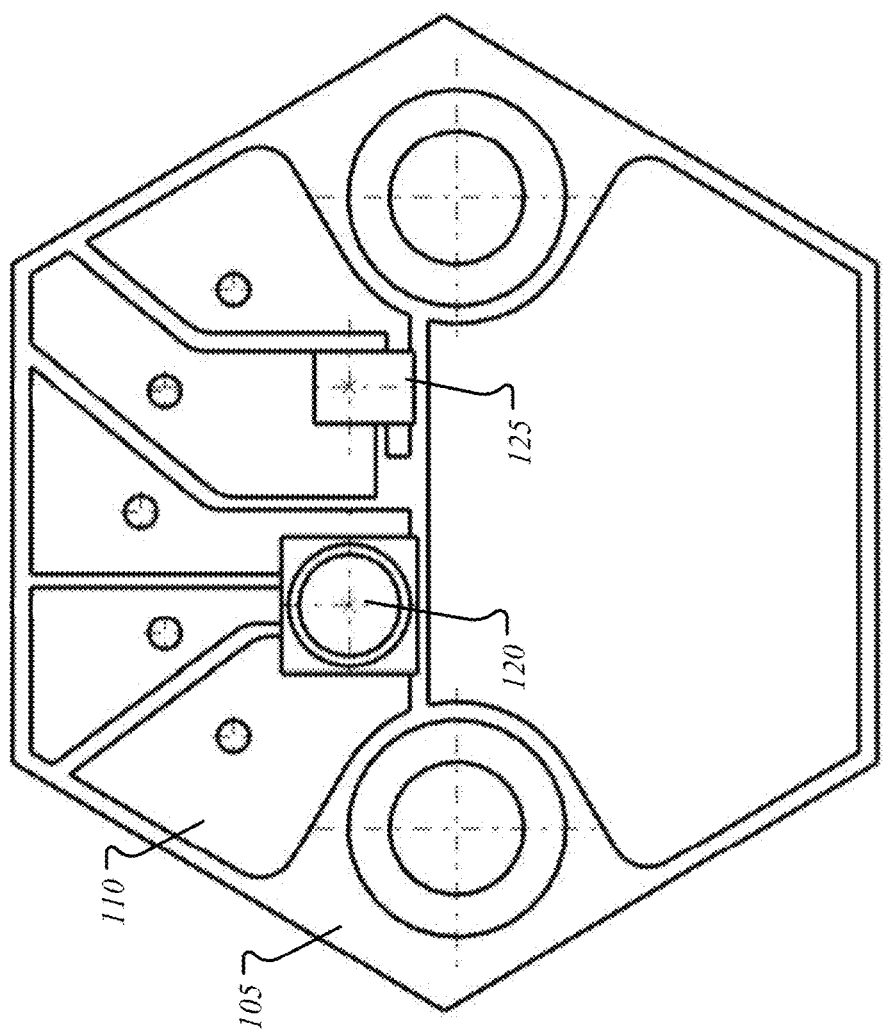
FIG. 2B is a top-down view of a light masking system, according to an exemplary embodiment of the present disclosure.
Figure 2C:
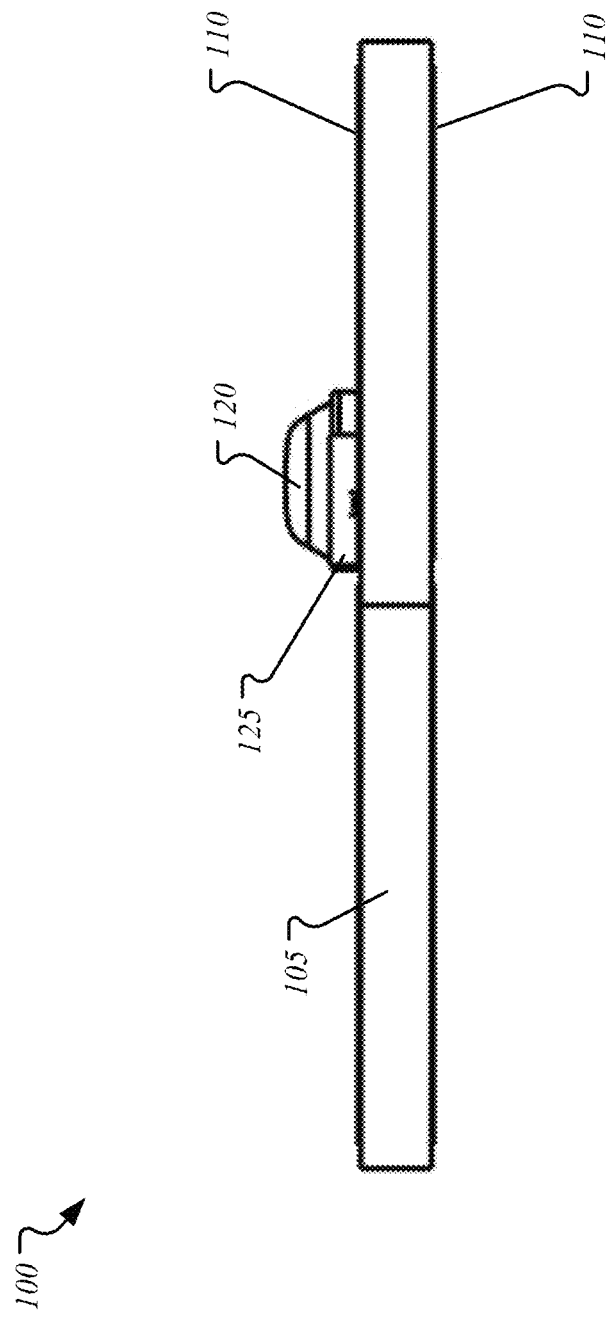
FIG. 2C is a profile view of a light masking system, according to an exemplary embodiment of the present disclosure.

FIGS. 2A-C show various views of a light masking system 100 for the vehicle, according to an embodiment of the present disclosure. The light masking system 100 may include a printed circuit board (PCB) 105, a conductive layer 110, capacitors and resistors 115, at least one IR LED 120 (herein referred to as "IR LED 120"), and at least one masking LED 125 (herein referred to as "masking LED 125").

As described herein, when a voltage is applied to the masking LED 125 and/or the IR LED 120, a radiant power is emitted with a portion of the radiant power being attributable to wavelengths of electromagnetic radiation in the visible spectrum and another portion being attributable to wavelengths of electromagnetic radiation in the infrared spectrum. Thus, herein, luminous intensity refers to an intensity of the visible light emitted. When adjusting voltage of the masking LED 125 and/or the IR LED 120, the radiant power as a whole changes and the portions attributable to the visible spectrum and infrared spectrum change proportionally.

In an embodiment, the PCB 105 may be a circuit board commonly employed in the art. For example, a single-sided, double-sided, or multi-layered PCB. The PCB 105 may also be, for example, an integrated circuit (IC) such as an application-specific IC, or a hybrid circuit. The PCB 105 may be fabricated from typical substrate materials, such as epoxy resin impregnated with woven glass fiber, FR4, IMS, or sub-mount. The conductive layer 110 may be disposed on a top surface of the PCB 105 and used to electrically connect components on the top surface, such as the capacitors and resistors 115. An additional conductive layer 110 may be disposed on a bottom surface of the PCB 105, and in a multi-layer PCB 105, multiple PCB 105 panels (which are insulating) may be stacked in layers that alternate with layers of the conductive layer 110.

The conductive layer 110 may be formed from a conductive film, such as copper, silver, gold, aluminum, etc. As shown (not labeled), the PCB 105 may include a plurality of vias, such as through-hole vias, blind vias, buried vias, etc. that electrically connect components in or on various layers of the PCB 105. For example, a capacitor or resistor 115 on the top surface may be connected to another component or grounding coating on the bottom layer via a through-hole via. A power source may supply power to the PCB 105 and electronic components installed thereon.

In an embodiment, the IR LED 120 may emit electromagnetic radiation (i.e. light) at a centroid peak wavelength of approximately 850 nm with a predetermined radiant intensity. The predetermined radiant intensity may be determined by myriad factors, including proximity to the masking LED 125, position on the vehicle, and regulations, for instance. The IR LED 120 may receive a voltage from a power source in order to emit light. Notably, the power source may vary the supplied current to vary the radiant intensity. For example, the IR LED 120 may be configured to illuminate in a pulsed mode, wherein the IR LED 120 emits light at predetermined intervals of time and otherwise does not emit light. The pulsed mode may be of benefit to thermal performance of the IR LED 120—the supplied current may be higher (as compared to a steady-state emitting IR LED 120) in order to achieve higher output at each pulse and the IR LED 120 is able to cool down between pulses. The pulse mode would, in essence, create an effect of a flashing red light on the vehicle (further lending to the importance of masking said visible light from the IR LED 120).

The emission wavelength of the IR LED 120 may be determined by the semiconductors used in the fabrication of the IR LED 120. The perceived optical properties may be adjusted by altering IR LED 120 packaging, such as a lens. An emitted beam angle of the IR LED 120 light may range from wide to narrow. The emitted beam angle may be determined by an optional reflector or other optical directional apparatus, a size and design criteria of the semiconductors, a distance from the IR LED 120 to the top of the lens, and a geometry of the lens.

In an embodiment, the IR LED 120 may include a substantially hemispherical lens to facilitate emission of light from the IR LED 120. The hemispherical lens may result in a more symmetrical distribution of the light. Other shapes for the lens may be contemplated to yield varying emission patterns. For example, a planar or parabolic lens may be used for less symmetrical and more directed light (narrower beam angle) compared to the hemispherical lens.

Figure 3:
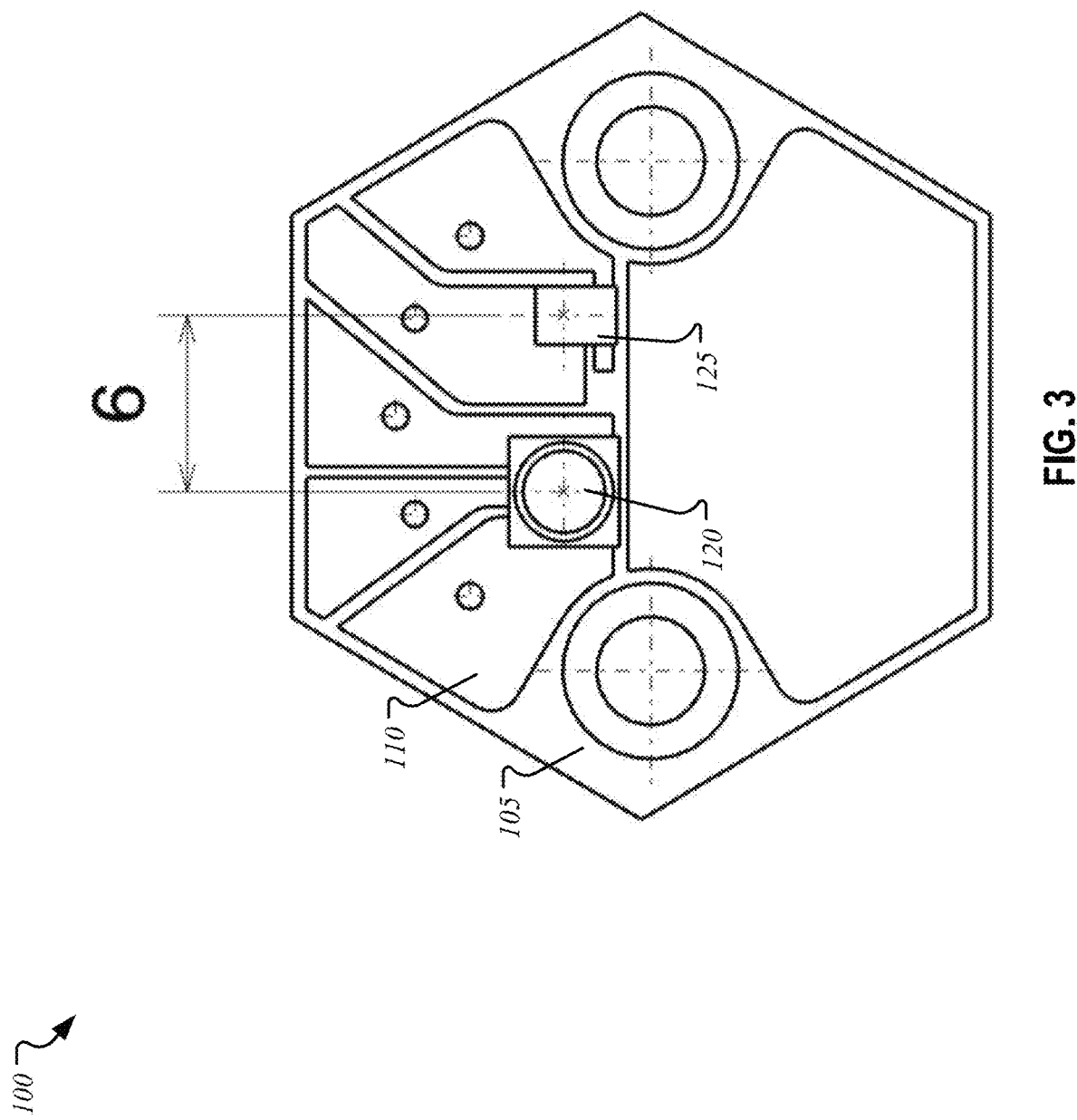
FIG. 3 is a schematic with measurements for a light masking system, according to an exemplary embodiment of the present disclosure.

FIG. 3 shows measurements for the light masking system 100, according to an embodiment of the present disclosure. In an embodiment, more than one IR LED 120, for example two IR LEDs 120, may be disposed on the top surface of the PCB 105 and electrically connected via the conductive layer 110 disposed between the IR LEDs 120 and the PCB 105.

Centers of the two IR LEDs 120 may be separated by a predetermined distance, for example 8 mm to 16 mm, or 10 mm to 14 mm, or preferably 12 mm. The lens of the IR LED 120 may have a radius of, for example, 1.5 mm. The light masking system 100 may have a length of 25 mm, a width of 13.8 mm, and a thickness of 1.6 mm (for the PCB 105). A pin header may be attached to the bottom of the PCB 105 that electrically connects the light masking system 100 to auxiliary components on the vehicle. The pin header may also include a heat sink configured to thermally contact the IR LED 120 and masking LED 125 to facilitate transfer away of heat generated by either light source.

In an embodiment, the masking LED 125 may emit a predetermined wavelength of visible light. For example, the masking LED 1235 may emit red light with a centroid peak wavelength of 700 nm. For example, the masking LED 1235 may emit amber/yellow light with a centroid peak wavelength of 600 nm. For example, the masking LED 1235 may emit white light with a broadband spectrum across the visible range, such as from 350 nm to 750 nm.

In an embodiment, one masking LED 125 may be disposed on the top surface of the PCB 105 between the two IR LEDs 120 and electrically connected to other components via the conductive layer 110 disposed between the masking LED 125 and the PCB 105. A center of the masking LED 125 may be separated from the center of the two IR LEDs 120 by a predetermined distance, for example 8 mm to 4 mm, or 7 mm to 5 mm, or preferably 6 mm.

In an embodiment, the masking LED 125 may be a monochromatic LED. The predetermined color and a luminous intensity of emitted light of the masking LED 125 may be determined by the location of the masking LED 125 on the vehicle. For example, the masking LED 125 may be located on the side and towards the front of the vehicle, and the predetermined color may be amber with a luminous intensity of less than 0.62 cd in order to represent a side illumination marker and stay within regulations. In another example, the masking LED 125 may be located on the rear of the vehicle, and the predetermined color may be red with a luminous intensity of less than 2 cd in order to represent a rear illumination/brake marker and stay within regulations. In another example, the masking LED 125 may be located on the front of the vehicle, and the predetermined color may be white (achromatic). It may be appreciated that the aforementioned examples may be combined on one vehicle wherein one or more of each example's light masking system 100 may be installed. In such an example, three different masking LEDs 125 may be used in various light masking systems 100 based on the location of each light masking system 100 on the vehicle.

In an embodiment, the masking LED 125 may be polychromatic and configured to emit one or more colors across a broad wavelength spectrum at varying luminous intensities. The masking LED 125 may be programmed to emit a predetermined color at a predetermined luminous intensity based on the location of the masking LED 125 on the vehicle. In the following examples, a single model of masking LED 125 may be used during fabrication to install in the light masking system 100, and any light masking system 100 may be installed at any location on the vehicle. For example, the masking LED 125 may be located on the side and towards the front of the vehicle, and the programmed emission color may be amber with a programmed luminous intensity of less than 0.62 candela (cd). The same masking LED 125 may be located instead on the rear of the vehicle, and the programmed emission color may be red with a programmed luminous intensity of less than 2 cd. Thus, the same model of masking LED 125 may be used in either location and programmed according to the location on the vehicle.

Advantageously, fabrication of the light masking system 100 is easier because only a single model of masking LED 125 is installed on the PCB 105 and any accidental installations of the incorrect masking system 100 at a particular location on the vehicle can be remedied by re-programming the masking LED 125.

Concomitantly, the luminous intensity of emitted light of the IR LED 120 may also be determined by the location of the IR LED 120 on the vehicle. In an embodiment, the IR LED 120 may emit at a radiant intensity less than (but nearly equal to) the luminous intensity of the proximal masking LED 125 in the same masking light system 100. For example, the IR LED 120 may emit at approximately 80% the radiant intensity as the proximal masking LED 125. For the masking LED 125 located on the side and towards the front of the vehicle, the predetermined luminous intensity of the masking LED 125 may be 0.60 cd and the predetermined radiant intensity of the IR LED 120 may be 0.48 cd. Advantageously, the greater luminous intensity of the masking LED 125 effectively masks the emission of the IR LED 120 while still resembling the same function of other lighting in the same area on the vehicle. That is to say, an observer (with visible light sensitivity) viewing the vehicle from any perspective may not see the visible light emission from the IR LED 120 since the masking LED 125 emission may sufficiently overpower the emission from the IR LED 120. Therefore, a red light emission from the IR LED 120 disposed proximal to the headlights, for instance, may not appear red to the observer since emission from the masking LED 125 (e.g. a white light) may overpower the red light. This may be coupled with emission from the headlights with, for example, additional white light.

It may be appreciated that the current supplied to the masking LED 125 and IR LED 120 may be adjusted in order to ensure that the emission of the masking LED 125 is sufficient to mask the emission of the IR LED 120 as determined by regulations at various vehicle locations and radiant intensities. To remain in compliance with FMVSS108 Section 6.2.1 *Impairment* (in original document F.R. Vol. 41 No. 164-23.081976), "No additional lamp, reflective device, or other motor vehicle equipment is permitted to be installed that impairs the effectiveness of lighting equipment required by this standard." The combined radiant intensity of the masking LED 125 and IR LED 120 must not cause impairment, and therefore, are not to exceed the legal minimum requirements of nearby existing lighting functions on the vehicle. In an embodiment, to ensure that the IR LED 120 complies with the strictest regulation, a single model of the IR LED 120 may be installed in all light masking systems 100. In an embodiment, the maximum radiant intensity may include the total output of both the IR LED 120 and the masking LED 125. For example, according to SAE J578, the IR LED 120 may emit at a maximum radiant intensity of less than 0.25 cd as set forth for the side rear illumination marker. For example, according to FMVSS108's Table X: Side Marker Lamp Photometry Requirements, the IR LED 120 may emit at a maximum radiant intensity of less than 0.25 cd and 0.62 cd for the rear and front side markers, respectively.

In an embodiment, the light masking system 100 may include two IR LEDs 120 and one masking LED 125 installed on the PCB 105, wherein the masking LED 125 may be disposed between the two IR LEDs 120 and separated by, for example, 6 mm between the center of the masking LED 125 and each of the two IR LEDs 120. The two IR LEDs 120 may be disposed on opposite sides of the masking LED 125 and separated by 12 mm. A single model of the IR LED 120 may be installed across all light masking systems 100 on the vehicle. The IR LED 120 may emit with a centroid peak wavelength of 850 nm when pulsed at 10 Hz with regulatory-complying intensity, wherein the radiant intensity of the IR LED 120 emission in the visible spectrum is masked by the luminous intensity of the masking LED 125, wherein the luminous intensity of the masking LED 125 is greater than the radiant intensity of the IR LED 120 emission in the visible spectrum and within regulation guidelines. It may be appreciated that other dimensions and number of masking LEDs 125 per IR LED 120 in vary arrangements may be implemented such that the radiant intensity of the IR LED 120 is sufficiently masked by the luminous intensity of the masking LEDs 125. In an embodiment, the camera or sensors may detect the presence of other vehicles within a predetermined range of the [main] vehicle and the radiant intensity of the IR LED 120 emission may be adjusted. That is, the IR LED 120 may be configured to emit at multiple power levels based on the proximity of other vehicles to the vehicle. For simplicity, a low and a high emission setting for the IR LED 120 are described, but multiple levels of output may be contemplated (e.g. a first setting, a second setting, a third setting, etc.). The camera or sensors may determine other vehicles are within the predetermined range of the main vehicle. For example, the predetermined range may be a 250 meter radius (inclusive). All of the IR LEDs 120 on the main vehicle may emit with a centroid wavelength of 850 nm and at the low setting of cd when the camera or the sensors determine the other vehicles are inside the predetermined range. Upon the other vehicles exiting the predetermined range of the main vehicle, the processing circuitry may increase the radiant intensity of the IR LEDs' 120 emission to the high setting in the range of, for example, 0.26 to 10 cd. The increased radiant intensity of the IR LEDs 120 may be achieved by, for example, increasing the power to the IR LEDs 120. Even though the increased radiant intensity of the IR LEDs' 120 emission may be greater than the luminous intensity of the proximal masking LED 125 emission, the portion of the visible light emitted by the IR LEDs 120 may not be detected by the other vehicles because the other vehicles are not within range of the main vehicle. Advantageously, the increase in radiant intensity of the IR LEDs 120 emission may allow for more sensitive detection of the IR light by the sensors on the main vehicle and the IR light may travel a greater distance (as compared to when at 0.25 cd) in order to detect objects farther ahead in the path of the main vehicle. Thus, the increased power of the IR LEDs 120 on the high setting allows the main vehicle to detect objects sooner and provides additional time to take corrective action and keep the main vehicle occupant(s) safe. Upon detecting the other vehicles have entered the predetermined range of the main vehicle, the radiant intensity of the IR LEDs' 120 emission may be decreased to the initial low setting of 0.25 cd to remain below regulation guidelines.

In an embodiment, the camera may be configured to capture images and the processing circuitry may be configured to analyze the image to recognize objects, for example the other vehicles, and determine a brightness and color of any light sources from the other vehicles. For example, the camera may capture a rear of another vehicle in front of the vehicle and the processing circuitry may determine the color of the lights are red (for tail lights) and above a predetermined brightness threshold to indicate the other vehicle is within range of the main vehicle. Thus, the radiant intensity of the IR LED 120 is adjusted to the low setting.

In an embodiment, the processing circuitry may determine the average brightness of the light sources over a predetermined duration. For example, the predetermined duration may be 5 seconds, and the extended window of time over which the average brightness is determined may advantageously filter out instances of bursts of brightness from other light sources that lead to false-positive readings of other vehicles being within range. The main vehicle may be traveling on a highway with periodic overhead light and the brightness from the overhead lights may incorrectly trigger the processing circuitry to adjust the radiant intensity of the IR LED 120 to the low setting. Thus, the 5 second window over which the average brightness is determined may reduce the brightness contributed to the reading from the overhead lighting. In addition, the image recognition from the camera may also be used in combination with the brightness reading to determine that the light source is from the overhead lighting instead of another vehicle.

In an embodiment, the sensors may be configured to detect IR light emitted from the IR LEDs 120 that reflect off of objects proximal to the main vehicle and return to the sensors. The processing circuitry may be configured to determine a delay between the emission of the IR light and detection by the sensors and, based on the delay, determine the distance of the object from the main vehicle. Based on the distance of the object from the main vehicle, the processing circuitry may adjust the radiant intensity of the IR LEDs 120.

It may be appreciated that the brightness determination and image recognition by the camera may be used separately or in combination with the distance determination by the sensors to adjust the radiant intensity of the IR LEDs 120.

In an embodiment, the camera or sensors may detect the presence of other vehicles within the predetermined range of the main vehicle relative to the orientation of the main vehicle. Upon determining the presence and orientation of the other vehicles relative to the main vehicle, the processing circuitry may adjust the emission radiant intensity of a subset of the IR LEDs 120. For example, the camera or sensors may determine the other vehicles are outside the predetermined range in a front direction of the main vehicle. Upon determining the front direction of the main vehicle is clear of the other vehicles, the processing circuitry may increase the radiant intensity of the IR LEDs 120 facing the front direction to the high setting. The IR LEDs 120 in the light masking systems 100 installed at the front of the vehicle (white headlights) and on the side towards the front of the vehicle (amber side markers) may be adjusted to the high setting, for instance, while those installed at the rear of the vehicle (red tail lights) and on the side towards the rear of the vehicle (red side markers) remain in the low setting. Again, the increase in emission radiant intensity of the IR LEDs 120 facing the front direction may allow for more sensitive detection of the IR light by the front-facing sensors on the main vehicle and the IR light may travel a greater distance (as compared to when at 0.25 cd) in order to detect objects farther ahead in front of the main vehicle. In another example, the processing circuitry may determine the other vehicles are outside the predetermined range in a rear direction of the main vehicle.

Upon determining the rear direction of the main vehicle is clear of the other vehicles, the processing circuitry may increase the radiant intensity of the IR LEDs 120 facing the rear direction to the high setting. The IR LEDs 120 in the light masking systems 100 installed at the rear of the vehicle (red tail lights) and on the side towards the rear of the vehicle (red side markers) may be adjusted, for instance, while those installed at the front and on the side towards the front of the vehicle remain in the low setting. The increase in emission radiant intensity of the IR LEDs 120 facing the rear direction may allow for more sensitive detection of the IR light by the rear-facing sensors on the main vehicle and the IR light may travel a greater distance (as compared to when at 0.25 cd) in order to detect objects farther back behind the main vehicle. The rear-facing sensors may detect other vehicles approaching from the rear direction and take pre-emptive action to warn the approaching other vehicles upon determining a speed of the approaching other vehicle is too fast. For example, in response to determining the approaching other vehicle is traveling too fast, the processing circuitry may be configured to flash the rear-facing masking LEDs 125 and other tail lights, activate a horn on the vehicle, or a combination thereof to warn the approaching other vehicle. Upon detecting the other vehicles have entered the predetermined range of the main vehicle in either direction, the emission radiant intensity of the respective IR LEDs 120 may be decreased to the initial 0.25 cd to remain below regulation guidelines.

In an embodiment, the IR LED 120 may be located proximal to a light source on the vehicle. That is to say, the existing functional LEDs and light sources on the vehicle may be utilized to mask the emission of the IR LED 120. For example, the IR LED 120 may be installed on the light masking system 100 and the light masking system 100 may be installed proximal to the head light of the vehicle. The emission luminous intensity of the head lights may be sufficient to mask the emission of the proximal IR LED 120. In another example, the IR LED 120 may be installed as part of the head light assembly and not as part of the light masking system 100. It may be appreciated that the IR LED 120 may be incorporated into other existing light sources on the vehicle having sufficient emission luminous intensity.

Figure 4:
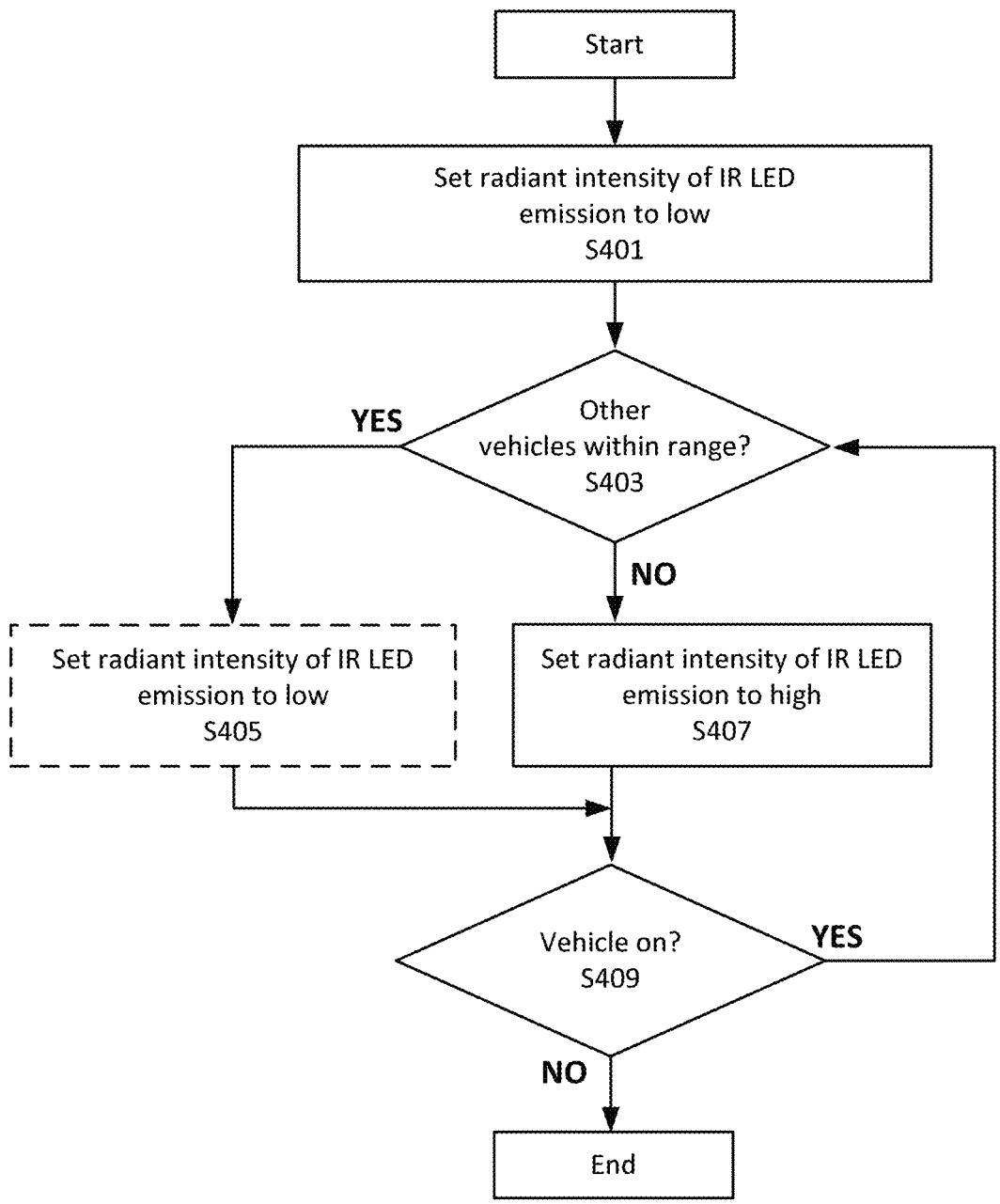
FIG. 4 is a flow chart for a method of adaptively masking an IR LED emission, according to an exemplary embodiment of the present disclosure.

FIG. 4 shows a flow chart for a method of adaptively masking the IR LED 120 emission, according to an embodiment of the present disclosure. In step S401, the radiant intensity of the IR LED 120 is set to the low emission setting, for example 0.25 cd. In step S403, the processing circuitry and sensors determine if other vehicles are within range of the main vehicle. In optional step S405, the low emission setting is maintained if other vehicles are within range of the main vehicle. In step S407, the radiant intensity of the IR LED 120 is set to the high emission setting, for example 10 cd, if other vehicles are not within range of the main vehicle. In step S409, processing circuitry and sensors determine if the vehicle is still powered on. The method repeats back to step S403 if the vehicle is on, otherwise the method ends and the lights are turned off.

Figure 5:
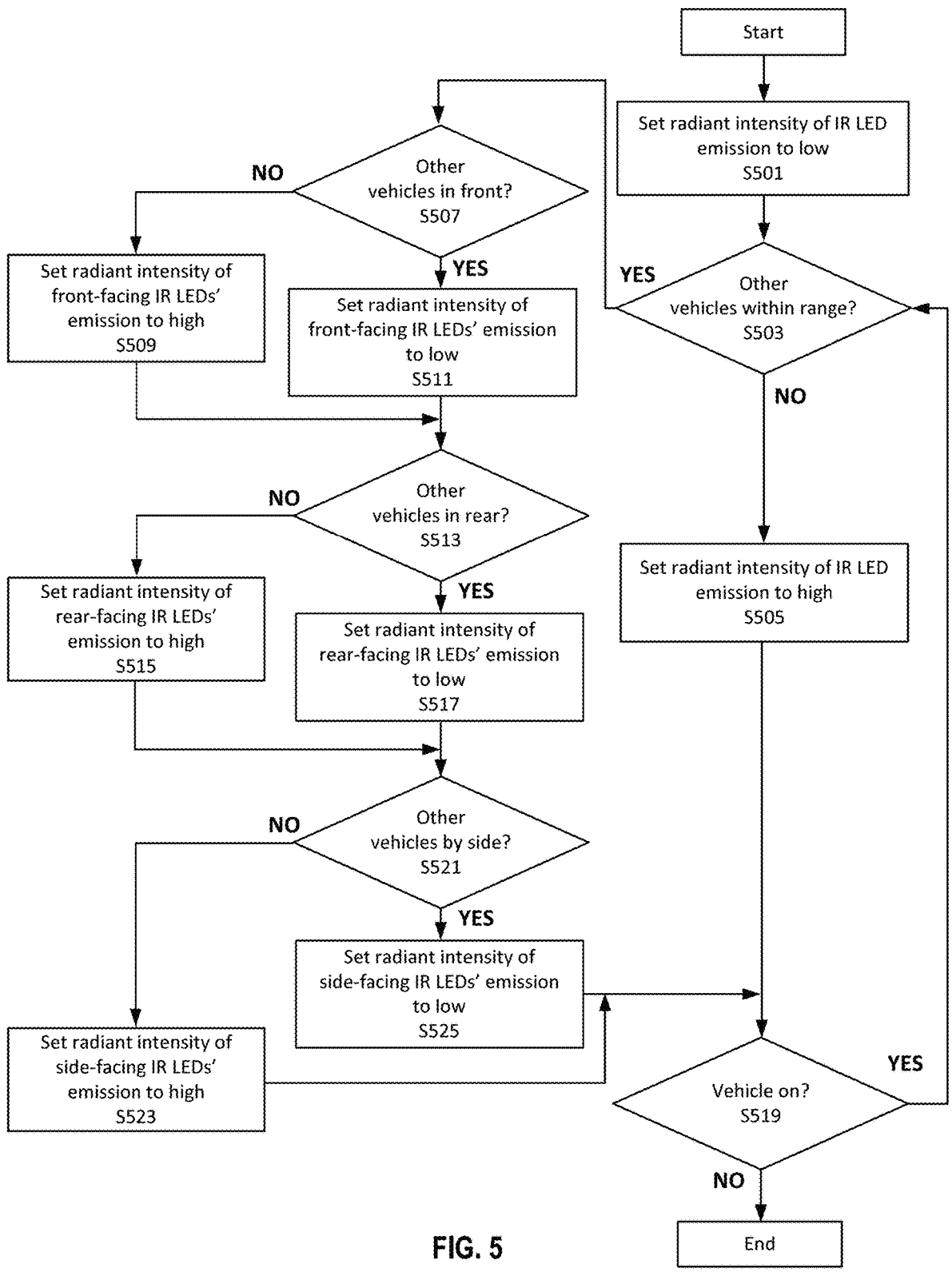
FIG. 5 is a flow chart for a method of adaptively masking an IR LED emission with consideration for other vehicle proximity, according to an exemplary embodiment of the present disclosure.

FIG. 5 shows a flow chart for a method of adaptively masking the IR LED 120 emission with consideration for other vehicle proximity, according to an embodiment of the present disclosure. In step S501, the radiant intensity of the IR LED 120 is set to the low emission setting, for example 0.25 cd. In step S503, the processing circuitry and sensors determine if other vehicles are within range of the main vehicle. In step S505, the radiant intensity of the IR LED 120 is set to the high emission setting, for example 10 cd, if other vehicles are not within range of the main vehicle.

If the other vehicles are present, the method proceeds to step S507, wherein processing circuitry and sensors determine if the other vehicles are in range in front of the main vehicle. In step S509, the radiant intensity of the front-facing IR LEDs 120 is set to the high emission setting, for example 10 cd, if the other vehicles are not detected in front of the main vehicle. In step S511, the radiant intensity of the front-facing IR LEDs 120 is set to the low emission setting (or maintained at the low emission setting), for example 0.25 cd, if the other vehicles are detected in front of the main vehicle.

In step S513, processing circuitry and sensors determine if the other vehicles are in range in the rear direction of the main vehicle. In step S515, the radiant intensity of the rear-facing IR LEDs 120 is set to the high emission setting, for example 10 cd, if the other vehicles are not detected towards the rear direction of the main vehicle. In step S517, the radiant intensity of the rear-facing IR LEDs 120 is set to the low emission setting (or maintained at the low emission setting), for example 0.25 cd, if the other vehicles are detected towards the rear of the main vehicle.

In step S521, processing circuitry and sensors determine if the other vehicles are in range in the side direction of the main vehicle. In step S523, the radiant intensity of the side-facing IR LEDs 120 is set to the high emission setting, for example 10 cd, if the other vehicles are not detected towards the side direction of the main vehicle. In step S525, the radiant intensity of the side-facing IR LEDs 120 is set to the low emission setting (or maintained at the low emission setting), for example 0.25 cd, if the other vehicles are detected towards the side of the main vehicle.

In step S519, processing circuitry and sensors determine if the vehicle is still powered on. The method repeats back to step S503 if the vehicle is on, otherwise the method ends and the lights are turned off.

Figure 6:
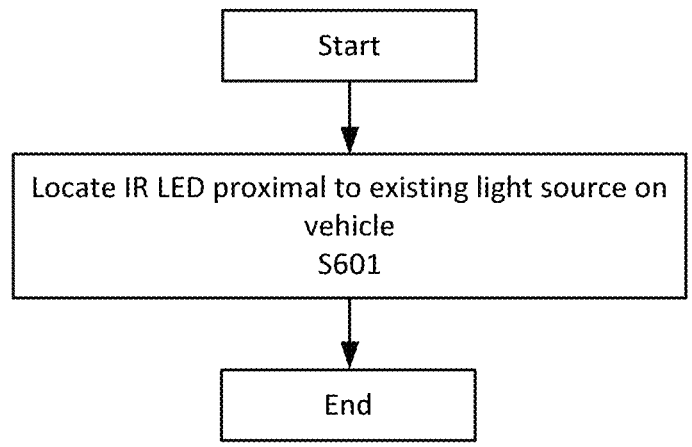
FIG. 6 is a flow chart for a method of locating an IR LED on a vehicle, according to an exemplary embodiment of the present disclosure.

FIG. 6 shows a flow chart for a method of locating the IR LED 120 on the vehicle, according to an embodiment of the present disclosure. In step S601, the IR LED 120 is located proximal to any existing light source on the vehicle. For example, within 6 mm of the existing light source.

In summary, an advantage of the present disclosure is the ability for the light masking system 100 to be located at any predetermined location on the vehicle. The light masking system 100 utilizes an IR imaging system (cameras, sensors, and the IR LEDs 120) and the masking LED 125 to mask only the visible light emitted from the IR LED 120, thus allowing tunability of the NIR LED 120 location to anywhere on the vehicle. The location of the IR LED 120 is sufficiently proximal to the masking LED 125 wherein the masking LED 125 is constantly emitting light. For example, during the day the supplemental light source may be a daytime running headlight emitting white light having a predetermined luminous intensity to mask the NIR LED partial visible light emission. For example, at night the supplemental light source may be a tail light emitting red light having a predetermined luminous intensity to mask the NIR LED partial visible light emission.

Figure 7:
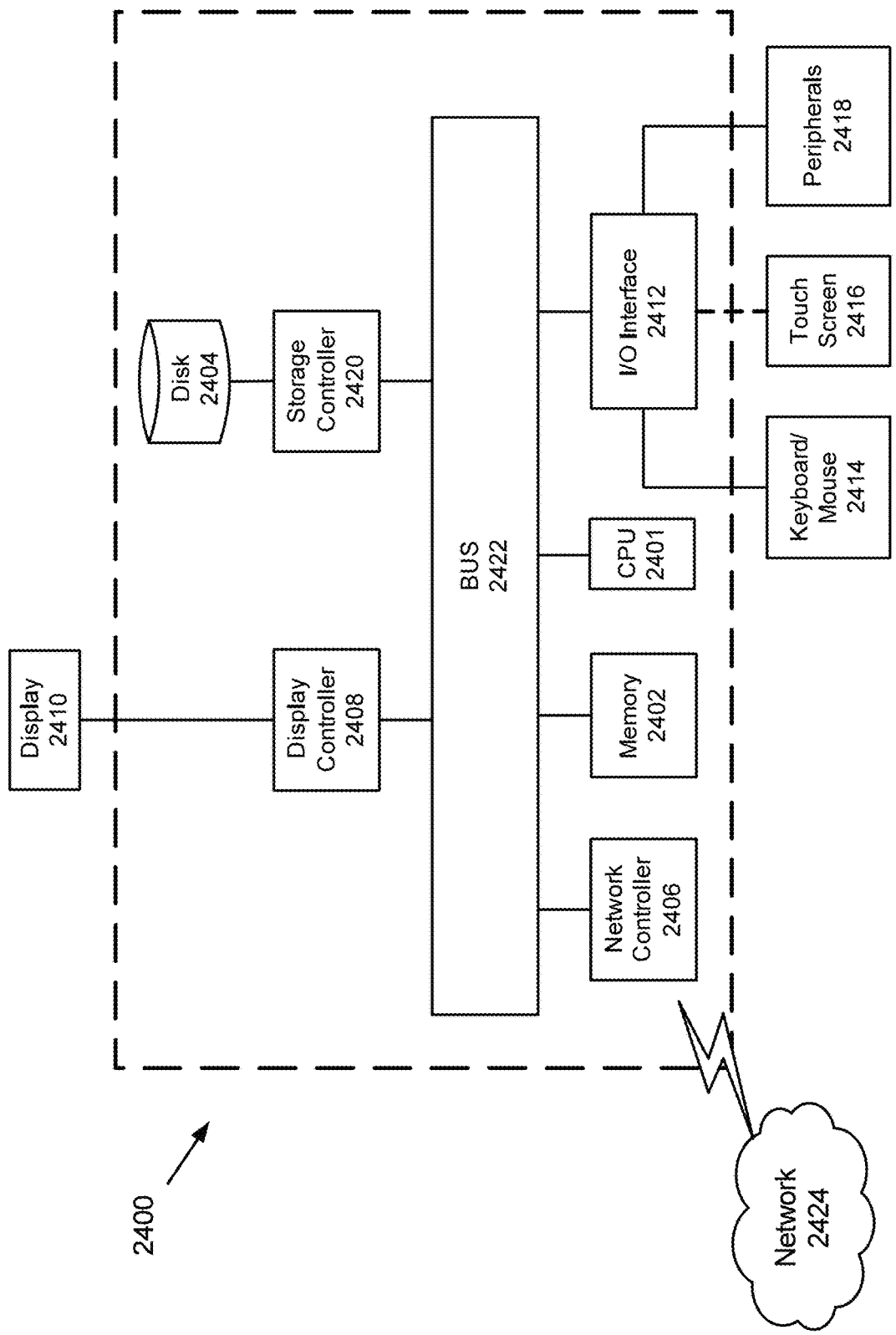
FIG. 7 is a block diagram of a hardware description of a computer; according to an exemplary embodiment of the present disclosure.

FIG. 7 is a block diagram of a hardware description of a computer 2400 used in exemplary embodiments. In the embodiments, computer 2400 can be a desk top, laptop, or server.

In FIG. 7, the computer 2400 includes a CPU 2401 which performs the processes described herein. The process data and instructions may be stored in memory 2402. These processes and instructions may also be stored on a storage medium disk 2404 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 2400 communicates, such as a server or computer.

Further, the claimed advancements may be provided as a utility application, background daemon, or component of an operating system, or combination thereof, executing in conjunction with CPU 2401 and an operating system such as Microsoft® Windows®, UNIX®, Oracle® Solaris, LINUX®, Apple macOS® and other systems known to those skilled in the art. In order to achieve the computer 2400, the hardware elements may be realized by various circuitry elements, known to those skilled in the art. For example, CPU 2401 may be a Xenon® or Core® processor from Intel Corporation of America or an Opteron® processor from AMD of America, or may be other processor types that would be recognized by one of ordinary skill in the art. Alternatively, the CPU 2401 may be implemented on an FPGA, ASIC, PLD or using discrete logic circuits, as one of ordinary skill in the art would recognize. Further, CPU 2401 may be implemented as multiple processors cooperatively working in parallel to perform the instructions of the inventive processes described above.

The computer 2400 in FIG. 7 also includes a network controller 2406, such as an Intel Ethernet PRO network interface card from Intel Corporation of America, for interfacing with network 2424. As can be appreciated, the network 2424 can be a public network, such as the Internet, or a private network such as LAN or WAN network, or any combination thereof and can also include PSTN or ISDN sub-networks. The network 2424 can also be wired, such as an Ethernet network, or can be wireless such as a cellular network including EDGE, 3G and 4G wireless cellular systems. The wireless network can also be WiFi®, Bluetooth®, or any other wireless form of communication that is known.

The computer 2400 further includes a display controller 2408, such as a NVIDIA® GeForce® GTX or Quadro® graphics adaptor from NVIDIA Corporation of America for interfacing with display 2410, such as a Hewlett Packard® HPL2445w LCD monitor. A general purpose I/O interface 2412 interfaces with a keyboard and/or mouse 2414 as well as an optional touch screen panel 2416 on or separate from display 2410. General purpose I/O interface 2412 also connects to a variety of peripherals 2418 including printers and scanners, such as an OfficeJet® or DeskJet® from Hewlett Packard.

The general purpose storage controller 2420 connects the storage medium disk 2404 with communication bus 2422, which may be an ISA, EISA, VESA, PCI, or similar, for interconnecting all of the components of the computer 2400. A description of the general features and functionality of the display 2410, keyboard and/or mouse 2414, as well as the display controller 2408, storage controller 2420, network controller 2406, and general purpose I/O interface 2412 is omitted herein for brevity as these features are known.

Figure 8:
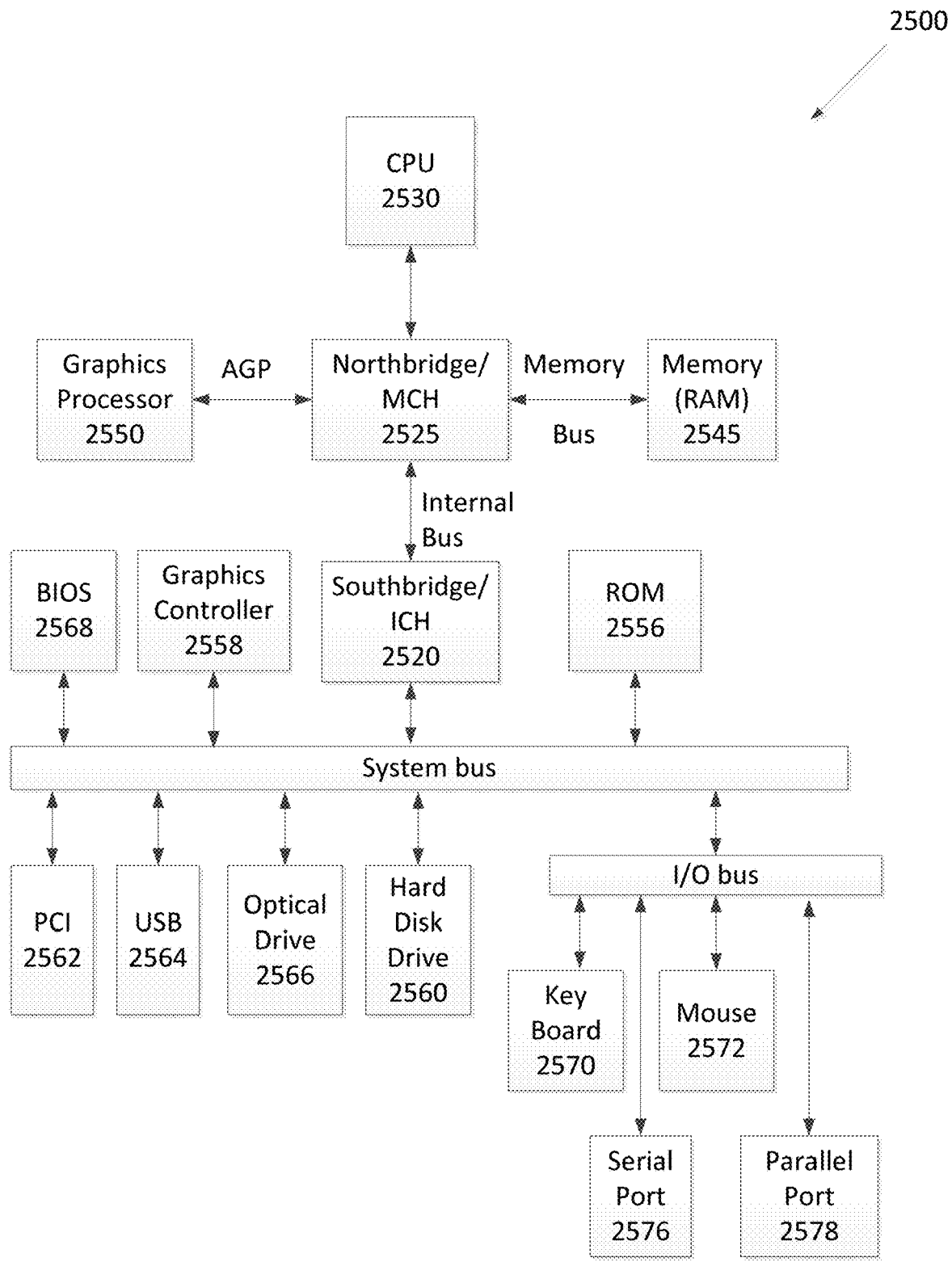
FIG. 8 is a schematic diagram of an exemplary data processing system, according to an exemplary embodiment of the present disclosure.

FIG. 8 is a schematic diagram of an exemplary data processing system. The data processing system is an example of a computer in which code or instructions implementing the processes of the illustrative embodiments can be located.

In FIG. 8, data processing system 2500 employs an application architecture including a north bridge and memory controller hub (NB/MCH) 2525 and a south bridge and input/output (I/O) controller hub (SB/ICH) 2520. The central processing unit (CPU) 2530 is connected to NB/MCH 2525. The NB/MCH 2525 also connects to the memory 2545 via a memory bus, and connects to the graphics processor 2550 via an accelerated graphics port (AGP). The NB/MCH 2525 also connects to the SB/ICH 2520 via an internal bus (e.g., a unified media interface or a direct media interface). The CPU 2530 can contain one or more processors and even can be implemented using one or more heterogeneous processor systems.

Figure 9:
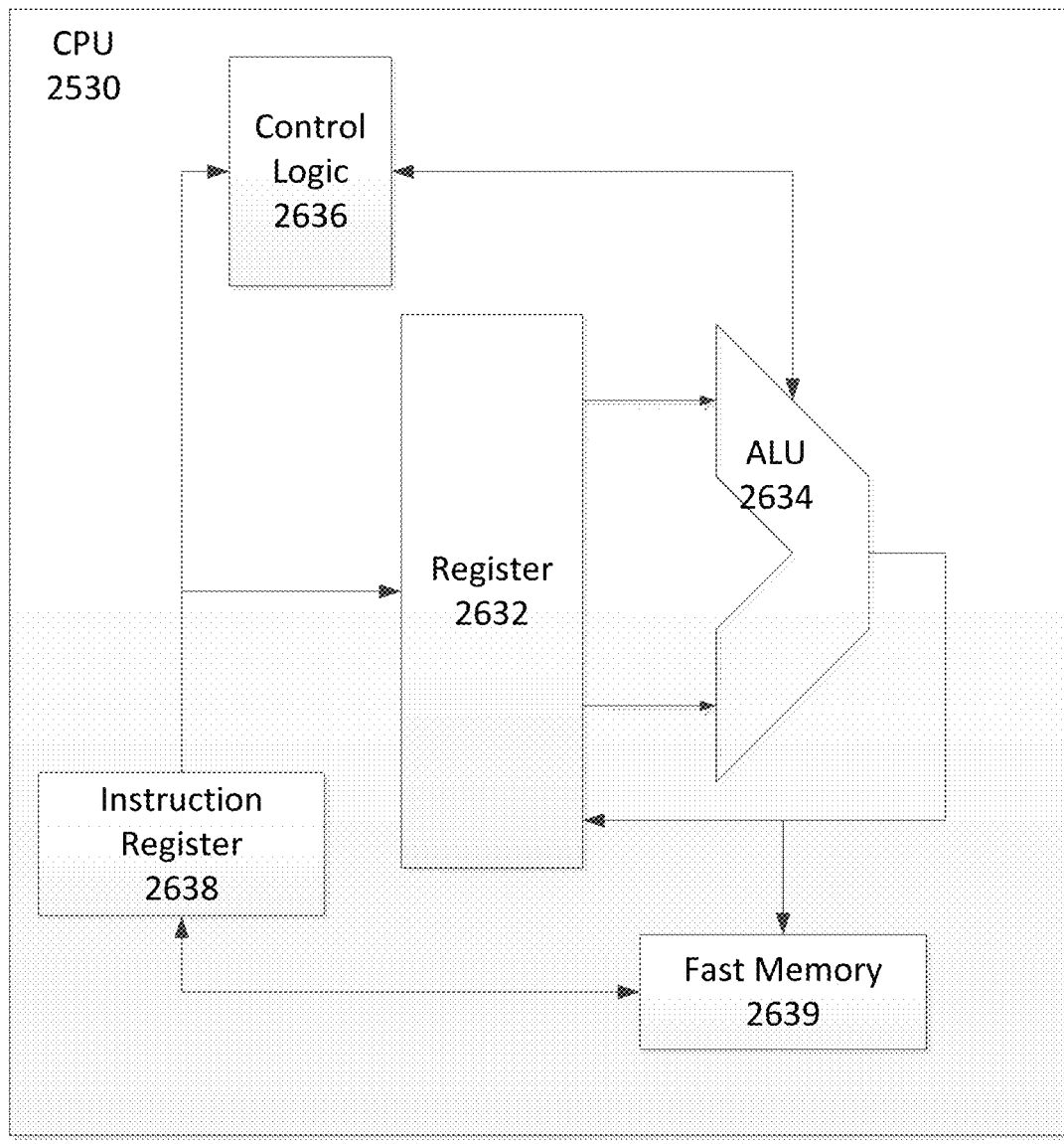
FIG. 9 is an implementation of a central processing unit, according to an exemplary embodiment of the present disclosure.

FIG. 9 illustrates an implementation of CPU 2530. In one implementation, an instruction register 2638 retrieves instructions from a fast memory 2639. At least part of these instructions are fetched from an instruction register 2638 by a control logic 2636 and interpreted according to the instruction set architecture of the CPU 2530. Part of the instructions can also be directed to a register 2632. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using an arithmetic logic unit (ALU) 2634 that loads values from the register 2632 and performs logical and mathematical operations on the loaded values according to the instructions. The results from these operations can be fed back into the register 2632 and/or stored in a fast memory 2639. According to embodiments of the disclosure, the instruction set architecture of the CPU 2530 can use a reduced instruction set computer (RISC), a complex instruction set computer (CISC), a vector processor architecture, or a very long instruction word (VLIW) architecture. Furthermore, the CPU 2530 can be based on the Von Neuman model or the Harvard model. The CPU 2530 can be a digital signal processor, an FPGA, an ASIC, a PLA, a PLD, or a CPLD. Further, the CPU 2530 can be an x86 processor by Intel or by AMD; an ARM processor; a Power architecture processor by, e.g., IBM; a SPARC architecture processor by Sun Microsystems or by Oracle; or other known CPU architectures.

Referring again to FIG. 8, the data processing system 2500 can include the SB/ICH 2520 being coupled through a system bus to an I/O Bus, a read only memory (ROM) 2556, universal serial bus (USB) port 2564, a flash binary input/output system (BIOS) 2568, and a graphics controller 2558. PCI/PCIe devices can also be coupled to SB/ICH 2520 through a PCI bus 2562.

The PCI devices can include, for example, Ethernet adapters, add-in cards, and PC cards for notebook computers. The Hard disk drive 2560 and CD-ROM 2566 can use, for example, an integrated drive electronics (IDE) or serial advanced technology attachment (SATA) interface. In one implementation the I/O bus can include a super I/O (SIO) device.

Further, the hard disk drive (HDD) 2560 and optical drive 2566 can also be coupled to the SB/ICH 2520 through a system bus. In one implementation, a keyboard 2570, a mouse 2572, a parallel port 2578, and a serial port 2576 can be connected to the system bus through the I/O bus. Other peripherals and devices can be connected to the SB/ICH 2520 using a mass storage controller such as SATA or PATA, an Ethernet port, an ISA bus, a LPC bridge, SMBus, a DMA controller, and an Audio Codec.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components.

The foregoing discussion describes merely exemplary embodiments of the present disclosure. As will be understood by those skilled in the art, the present disclosure may be embodied in other specific forms without departing from the spirit or essential characteristics thereof. Accordingly, the disclosure is intended to be illustrative, but not limiting of the scope of the disclosure, as well as the claims. The disclosure, including any readily discernible variants of the teachings herein, defines in part, the scope of the foregoing claim terminology such that no inventive subject matter is dedicated to the public.

What is claimed is:

1. A light masking system for a vehicle, comprising:
   a printed circuit board (PCB);
   processing circuitry;
   at least one infrared (IR) light source disposed on a first surface of the PCB and configured to emit a first predetermined wavelength range of light;
   at least one masking light source disposed on the first surface of the PCB proximal to the IR light source and configured to emit a second predetermined wavelength range of light, wherein
   a portion of the emitted first predetermined wavelength range of light of the IR light source includes visible light; and
   the emitted second predetermined wavelength range of light of the at least one masking light source masks the emitted visible light from the first predetermined wavelength range of the at least one IR light source, with the processing circuitry configured to adjust luminous intensity of the at least one masking light source emission to greater than or equal to radiant intensity of the at least one IR light source emission.

2. The light masking system of claim 1, wherein
   the at least one IR light source is a light emitting diode (LED) with a peak wavelength of 850 nm; and
   the at least one masking light source is an LED.

3. The light masking system of claim 2, wherein
   the at least one masking light source is configured to emit one or more peak wavelengths of light spanning a range of 350 nm to 750 nm.

4. The light masking system of claim 3, wherein
   the one or more peak wavelengths of light emitted by the at least one masking light source is based on a location of the at least one masking light source on the vehicle.

5. The light masking system of claim 1, wherein the processing circuitry is configured to
   adjust, for the at least one IR light source emission, a predetermined radiant intensity; and
   adjust, for the at least one masking light source emission, a predetermined luminous intensity and a peak wavelength.

6. The light masking system of claim 5, wherein
   adjusting the predetermined radiant intensity of the at least one IR light source emission is based on the location of the at least one IR light source on the vehicle; and
   adjusting the predetermined luminous intensity and the peak wavelength of the at least one masking light source emission is based on the location of the at least one masking light source on the vehicle.

7. The light masking system of claim 6, wherein
the at least one IR light source and the at least one masking light source are located on a side of the vehicle and towards a rear of the vehicle;
the processing circuitry adjusts the radiant intensity of the at least one IR light source emission to less than 0.25 candela (cd);
the processing circuitry adjusts the peak wavelength of the at least one masking light source emission to a wavelength within the range of 700 nm to 750 nm.

8. The light masking system of claim 6, wherein
the at least one IR light source and the at least one masking light source are located on a side of the vehicle and towards a front of the vehicle;
the processing circuitry adjusts the radiant intensity of the at least one IR light source emission to less than 0.62 candela (cd);
the processing circuitry adjusts the peak wavelength of the at least one masking light source emission to a wavelength within the range of 600 nm to 650 nm.

9. The light masking system of claim 1, further comprising:
at least one capacitor and resistor disposed on the first surface of the PCB;
a conductive layer disposed on the first surface of the PCB and configured to electrically connect the at least one IR light source, the at least one masking light source, and the at least one capacitor and resistor to a power source.

10. The light masking system of claim 1, the at least one masking light source emits in a substantially constant emission mode.

11. A method of masking IR light in a light masking system for a vehicle, comprising:
setting, via processing circuitry, a predetermined emission radiant intensity of at least one IR light source disposed on a first surface of a printed circuit board (PCB), the IR light source configured to emit a predetermined wavelength range of light;
setting, via processing circuitry, a predetermined emission luminous intensity of at least one masking light source disposed on the first surface of the printed circuit board (PCB) and proximal to the at least one IR light source, wherein the predetermined emission luminous intensity of the at least one masking light source is greater than the predetermined emission luminous intensity of the at least one IR light source;
determining, via processing circuitry, when the vehicle is within a predetermined range of other vehicles; and
adjusting, via processing circuitry, the predetermined emission radiant intensity of the at least one IR light source in response to being within a predetermined range of the other vehicles, and in response to determining the other vehicles are outside a predetermined range, setting the predetermined emission radiant intensity of the at least one IR light source to a high setting, wherein a portion of the emitted predetermined wavelength range of light of the IR light source includes visible light.

12. The method of claim 11, further comprising:
adjusting, via processing circuitry, a predetermined peak wavelength of the at least one masking light source based on a location of the at least one masking light source on the vehicle.

13. The method of claim 11, wherein
adjusting the predetermined emission radiant intensity of the at least one IR light source further comprises:
in response to determining the other vehicles are within a predetermined range, setting the predetermined emission radiant intensity of the at least one IR light source to a low setting.

14. The method of claim 11, wherein
determining when the vehicle is within a predetermined range of the other vehicles further comprises:
determining, when the vehicle is within a predetermined range of the other vehicles, an orientation of the other vehicles relative to the vehicle; and
adjusting the predetermined emission radiant intensity of the at least one IR light source further comprises:
in response to determining the orientation of the other vehicles are not in a front direction of the vehicle, setting the predetermined emission radiant intensity of a front-facing IR light source of the at least one IR light source to a high setting; and
in response to determining the orientation of the other vehicle is not in a rear direction of the vehicle, setting the predetermined emission radiant intensity of a rear-facing IR light source of the at least one IR light source to a high setting.

15. The method of claim 11, wherein
the at least one IR light source and the at least one masking light source are located on a side of the vehicle and towards a front of the vehicle;
the processing circuitry adjusts the radiant intensity of the at least one IR light source emission to less than 0.62 candela (cd);
the processing circuitry adjusts the luminous intensity of the at least one masking light source emission to greater than or equal to the radiant intensity of the at least one IR light source emission;
the processing circuitry adjusts the peak wavelength of the at least one masking light source emission to a wavelength within the range of 600 nm to 650 nm.

16. The method of claim 11, wherein
the at least one IR light source is a light emitting diode (LED) with a peak wavelength of 850 nm; and
the at least one masking light source is an LED.

17. The method of claim 11, wherein the at least one masking light source emits in a substantially constant emission mode.

18. A method of masking IR light for a vehicle, comprising:
locating at least one IR light source proximal to a visible light source on the vehicle, wherein
the at least one IR light source is configured to emit a predetermined wavelength range of light with a predetermined radiant intensity;
the visible light source is configured to emit a predetermined wavelength range of light in the visible spectrum with a predetermined luminous intensity;
a portion of the emitted predetermined wavelength range of light of the IR light source includes visible light;
the emitted predetermined wavelength range of light of the visible light source masks the emitted visible light from the predetermined wavelength range of the at least one IR light source; and
adjusting, with a processing circuit, a luminous intensity of the at least one masking light source emission to greater than or equal to a radiant intensity of the at least one IR light source emission.

19. The method of claim 18, wherein the at least one IR light source is integrated into an assembly for the visible light source.

20. The method of claim 18, wherein the at least one masking light source emits in a substantially constant emission mode.

\* \* \* \* \*